US009258067B2

(12) United States Patent
Kildal et al.

(10) Patent No.: US 9,258,067 B2
(45) Date of Patent: Feb. 9, 2016

(54) METHOD AND APPARATUS FOR MEASURING THE PERFORMANCE OF ANTENNAS, MOBILE PHONES AND OTHER WIRELESS TERMINALS

(75) Inventors: Per-Simon Kildal, Pixbo (SE); Charlie Orlenius, Gothenburg (SE)

(73) Assignee: BLUETEST AB, Gothenburg (SE)

( * ) Notice: Subject to any disclaimer, the term of this patent is extended or adjusted under 35 U.S.C. 154(b) by 63 days.

(21) Appl. No.: 14/115,000

(22) PCT Filed: Jun. 15, 2011

(86) PCT No.: PCT/EP2011/059953
§ 371 (c)(1),
(2), (4) Date: Jan. 2, 2014

(87) PCT Pub. No.: WO2012/171562
PCT Pub. Date: Dec. 20, 2012

(65) Prior Publication Data
US 2014/0141727 A1    May 22, 2014

(51) Int. Cl.
*H04B 17/00*    (2015.01)
*G01R 29/08*    (2006.01)
(Continued)

(52) U.S. Cl.
CPC ........ *H04B 17/0017* (2013.01); *G01R 29/0821* (2013.01); *G01R 29/105* (2013.01); *H04B 17/15* (2015.01)

(58) Field of Classification Search
CPC .................. H04B 17/0017; G01R 29/0821
USPC .......... 455/67.12, 67.14, 562.1, 575.5, 67.11, 455/423
See application file for complete search history.

(56) References Cited

U.S. PATENT DOCUMENTS 4,800,387 A * 1/1989 Joy .............................. 342/165
5,001,494 A * 3/1991 Dorman et al. ............... 343/703
(Continued)

FOREIGN PATENT DOCUMENTS

CN          1496483 A      5/2004
DE       19812923 A1      9/1999
(Continued)

OTHER PUBLICATIONS

Jungang Yin et al: "Characterization of multi-port Eleven antenna for use in MIMO system", Wireless Communication Systems. 2008. ISWCS '08. IEEE International Symposium on, IEEE, Piscataway, NJ, USA, Oct. 21, 2008, pp. 473-477, XP031380382.
(Continued)

*Primary Examiner* — Marceau Milord
(74) *Attorney, Agent, or Firm* — Harness, Dickey & Pierce, P.L.C.

(57) ABSTRACT

An apparatus including a chamber that defines an internal cavity therein, adapted to enclose the device under test, and including walls of an inwardly reflective material, rendering the walls reflective to electromagnetic waves, thereby simulating a multi-path environment. Thus, the chamber is a reverberation chamber. At least one moveable object and chamber antenna are arranged in the cavity. A measuring instrument is connected to the device under test and the chamber antenna, for measuring the transmission between them. Further, an improved antenna holder is disclosed, comprising three surfaces of a reflective material, said surfaces extending in planes which are orthogonal in relation to each other and each surface facing away from the other surfaces, and wherein a chamber antenna is arranged on each of said at least three surfaces. Other improvements relate to video surveillance, channel emulation and shielding.

32 Claims, 5 Drawing Sheets

(51) Int. Cl.
*G01R 29/10* (2006.01)
*H04B 17/15* (2015.01)

(56) References Cited

U.S. PATENT DOCUMENTS

| | | | |
|---|---|---|---|
| 5,134,405 A * | 7/1992 | Ishihara et al. | 342/1 |
| 5,530,412 A * | 6/1996 | Goldblum | 333/232 |
| 6,021,315 A * | 2/2000 | Telewski | 455/67.11 |
| 6,088,582 A * | 7/2000 | Canora et al. | 455/226.1 |
| 6,137,449 A * | 10/2000 | Kildal | 343/781 P |
| 6,525,657 B1 * | 2/2003 | Wojcik | 340/514 |
| 7,286,961 B2 | 10/2007 | Kildal | |
| 7,444,264 B2 | 10/2008 | Kildal | |
| 7,592,959 B1 * | 9/2009 | Bynum et al. | 343/703 |
| 8,130,162 B2 * | 3/2012 | Kildal | 343/792.5 |
| 8,228,247 B2 * | 7/2012 | Kitada et al. | 343/703 |
| 8,331,869 B2 * | 12/2012 | Foegelle | 455/67.12 |
| 8,872,080 B2 * | 10/2014 | Valenzuela Valdes et al. | 219/756 |
| 2002/0160717 A1 * | 10/2002 | Persson et al. | 455/67.1 |
| 2008/0056340 A1 | 3/2008 | Foegelle | |
| 2011/0230143 A1 | 9/2011 | Lundstrom et al. | |
| 2011/0263215 A1 | 10/2011 | Asplund et al. | |

FOREIGN PATENT DOCUMENTS

| | | |
|---|---|---|
| EP | 1223432 A1 | 7/2002 |
| JP | H04-29069 A | 1/1992 |
| JP | 11348471 | 12/1998 |
| JP | 2000-324063 A | 11/2000 |
| JP | 2007-124696 A | 5/2007 |
| JP | 2011-053016 A | 3/2011 |
| JP | 2011-061434 A | 3/2011 |
| WO | WO-2005/003795 A1 | 1/2005 |
| WO | WO-2010/026274 A1 | 3/2010 |
| WO | WO-2010/059103 A1 | 5/2010 |

OTHER PUBLICATIONS

Dinh Thanh Le et al: "Novel compact antennas for MIMO wireless communication systems", Advanced Technologies for Communications (ATC), 2010 International Conference on, IEEE, Piscataway, NJ, USA, Oct. 20, 2010, pp. 341-345, XP031838606.
Dimitra Psychogiou et al: "Switched diversity antennas characterized by a coverage probability parameter", German Microwave Conference, 2010, IEEE, Piscataway, NJ, USA, Mar. 15, 2010, pp. 16-19, XP031699481.
Ray D P Ed—Institute of Electrical and Electronics Engineers: "Advanced design considerations of semi-anechoic chambers", 2002 IEEE International Symposium on Electromagnetic Compatibility. EMC. Symposium Record. Minneapolis, MN, Aug. 19-23, 2002; [Internationl Symposium on Electromagnetic Compatibility], New York, NY:IEEE, US, Jan. 1, 2002, pp. 941-946 vol. 2, XP031098676.
Per-Simon Kildal et al: "Threshold Receiver Model for Throughput of Wireless Devices With MIMO and Frequency Diversity Measured in Reverberation Chamber", IEEE Antennas and Wireless Propagation Letters, IEEE, Piscataway, NJ, US, vol. 10, Jan. 1, 2011, pp. 1201-1204, XP011387756.
Xiaoming Chen et al: "Comparison of RMS delay spread and decay time measured in reverberation chamber", Antennas and Propagation (EUCAP), 2010 Proceedings of the Fourth European Conference on, IEEE, Piscataway, NJ, USA, Apr. 12, 2010, pp. 1-3, XP031706123.
Per-Simon Kildal: "OTA measurements of wireless stations in reverberation chamber versus anechoic chamber: from accuracy models to testing of MIMO systems", Antenna Technology (IWAT), 2010 International Workshop on, IEEE, Piscataway, NJ, USA, Mar. 1, 2010, pp. 1-4, XP031676474.
Charles Wright et al: "Utilizing a channel emulator with a reverberation chamber to create the optimal MIMO OTA test methodology", Mobile Congress (GMC), 2010 Global, IEEE, Piscataway, NJ, USA, Oct. 18, 2010, pp. 1-5, XP031800600.
International Search Report PCT/ISA/210 for PCT/EP2011/059953 dated Jun. 18, 2012.
Yin, J. et al., "Characterization of Multi-Port Eleven Antenna for Use in MIMO System," Wireless Communication Systems, pp. 473-477, Dec. 31, 2008.
Le, D.T. et al., "Novel Compact Antennas for MIMO Wireless Communication Systems," The 2010 International Conference on Advanced Technologies for Communications, pp. 341-345, Dec. 31, 2010.
Wright, C. et al., "Utilizing a Channel Emulator with a Reverberation Chamber to Create the Optimal MIMO OTA Test Methodology," Mobile Comgress (GMC), pp. 1-5, Dec. 31, 2010.
Kildal, P., "OTA measurements of wireless stations in reverberation chamber versus anechoic chamber: from accuracy models to testing of MIMO systems," Antenna Technology, pp. 1-7, Dec. 31, 2010.
Chinese Office Action and English translation thereof dated May 4, 2015.

* cited by examiner

METHOD AND APPARATUS FOR MEASURING THE PERFORMANCE OF ANTENNAS, MOBILE PHONES AND OTHER WIRELESS TERMINALS

CROSS-REFERENCE TO RELATED APPLICATIONS

This application is the national phase under 35 U.S.C. §371 of PCT International Application No. PCT/EP2011/059953 which has an International filing date of Jun. 15, 2011.

TECHNICAL FIELD OF THE INVENTION

The present invention relates to an improved method and apparatus for measuring the performance of a device under test (DUT), and in particular antennas, mobile phones and other wireless terminals. More specifically, the present invention relates to improvements in measurements performed in a chamber defining an internal cavity therein, adapted to enclose the device under test, and including walls of an inwardly reflective material, rendering the walls reflective to electromagnetic waves, thereby simulating a multipath environment, and also comprising at least one moveable object within the cavity for obtaining a multitude of mode distributions and thereby making the DUT receive a signal that vary strongly with time, commonly referred to as fading. Such measurement chambers are referred to as reverberation chambers or mode-stirred or field-stirred chambers.

BACKGROUND

The reverberation chamber, or mode-stirred chamber, was before year 2000 only known as an instrument to measure radiated emissions and susceptibility to radiation, i.e. for electromagnetic compatibility (EMC) testing. The required measurement uncertainty was then not so strict.

The U.S. Pat. No. 7,444,264 describes how the reverberation chamber could be used to measure e.g. the radiation efficiency of antennas and the total radiated power (TRP) of mobile and wireless terminals such as cellular phones. Several chamber improvements were introduced to get the desired uncertainty, which is much stricter than the EMC case.

The same measurement setups that are described in U.S. Pat. No. 7,444,264 were also used to determine the performance of antenna diversity, i.e. when the outputs of two antennas are combined in such a way that the deepest fading dips are reduced, see e.g. P.-S. Kildal and K. Rosengren, "Correlation and capacity of MIMO systems and mutual coupling, radiation efficiency and diversity gain of their antennas: Simulations and measurements in reverberation chamber", in IEEE Communications Magazine, Vol. 42, No. 12, December 2004.

The above-mentioned first works describe how antennas and transmitting mobile and wireless terminals, intended for use in fading multipath environment, can be characterized by measurements in a reverberation chamber. However, there was also a need for characterizing mobile and wireless terminals when they are receiving.

The receive performance is either characterized by a Bit-Error-Rate (BER) or a Frame-Error-Rate (FER), depending on which system the terminals are designed for, where the latter frame consist of several bits that are coded in a special way to reduce errors. The BER or FER will depend on the signal level present at the receiver. Therefore, the receiver sensitivity is defined as the level which provides a certain BER or FER, often chosen to be 0.5%. It is known how to measure the receiver sensitivity when a signal is connected directly to the port of the receiver of the terminal. This is often referred to as conductive measurements because the transmit signal is connected directly to the receiver without including any antenna or environment. Then, however, the performance of the antenna is not included in the measurements. Therefore, it has previously been described how to measure the receiver sensitivity in an anechoic chamber. This is done by using a base station emulator connected to the transmit antenna in the chamber, and locating the terminal on a turntable. The receiver sensitivity for a certain BER or FER is then determined by analyzing the received signal at the phone, at each of all the directions of incidence on the terminal. The latter directions are obtained by moving the turntable in the anechoic chamber. These receiver sensitivities will vary much with direction, because the received radiation pattern of the terminal is different for the different directions. Therefore, these values are averaged over all directions (which should be uniformly distributed over the complete unit sphere around the terminal). The averaged results are called Total Isotropic Sensitivity (TIS), and correspond to the conductive-measured receiver sensitivity minus the total radiation efficiency of the antenna. This TIS can also be measured in a reverberation chamber, by averaging over mode stirred positions and polarizations, thereby corresponding to the measurements of radiation efficiency when the terminal is receiving.

The above-mentioned procedure for measuring TIS is very time-consuming, both when it is performed in an anechoic chamber and in a reverberation chamber, because the sensitivity must be determined many times and averaged. Also, it does not test how the terminal works when it is exposed to a continuous fading of the input signal, which is representative of an actual environment.

Therefore, it was the purpose of U.S. Pat. No. 7,286,961 to describe how the reverberation chamber can be used to determine the receive performance of a mobile or wireless terminal when it is continuously exposed to a fading input signal, such as in a real environment. The continuous fading is obtained by moving the stirrers of the chamber continuously rather than in steps, and by measuring the receiver sensitivity for which the BER or FER has the desired value during this continuous movement of the stirrers. The latter method is called Average Fading Sensitivity (AFS) and is much faster than measuring TIS, because the sensitivity level only needs to be determined once.

The reverberation chamber can by making use of the above previous inventions be used for characterizing the complete performance of mobile and wireless terminals, both on transmit and receive, including transmit and receive performance of antennas, amplifiers, signal processing algorithms, and coding. This has opened up a large potential for RF testing in connection with terminals for more advanced future mobile communication systems referred to as 3G and 4G (third and fourth generation of mobile communication systems, also called LTE). Such systems make use of more than one antenna for both transmission and reception and will use these to adapt to the fading multipath environment, in order to improve battery life time and data rate. Such systems are known under terms as diversity antenna systems and MIMO (multiple Input Multiple Output) antenna systems. In order to develop optimum diversity and MIMO systems it will be more important than ever to quantify the performance of the terminals and base station simulators in multipath environments. The reverberation chamber can provide this testing opportunity.

The ultimate testing opportunity of the reverberation chamber is to measure data throughput of the whole communication system with diversity and MIMO capability, from the data input at the base station to the data output at the terminal, or vice versa. This contains the effects of radiated power, the wireless channel and receiver sensitivity in one performance value, referred to as the throughput, being the most important for the user. This throughput is a resulting data transfer rate, and the measurement setup in reverberation chamber is already described in scientific paper (J. Åsberg, A. Skårbratt, and C. Orlenius, "Over-the-air performance testing of wire-less terminals by data throughput measurements in reverberation chamber", European Conference on Antennas and Propagation ICAP 2011, 11-15 Apr. 2011, Rome).

The reverberation chamber can be loaded by using lossy objects inside the chamber or lossy material on the reflecting walls, in order to control the coherence bandwidth and time delay spread so that it resembles values in real-life environments. This loading affects the average mode bandwidth of the chamber, i.e. the Q of the chamber divided by the frequency of operation, and thereby also the coherence (or correlation) bandwidth. Preferably, the loading is not too strong, because then the resonances of the cavity modes disappear, and the chamber will no more have the desired function.

The reverberation chamber can always be improved with respect to both measurement accuracy and resemblance to practical environments. The uncertainty is at present good enough compared to alternative measurement techniques, but a more accurate chamber will allow measurements at a lower frequency or in a smaller chamber and at shorter time, which is attractive. The reverberation chamber represents an isotropic multipath environment with a uniform distribution of angles of arrival of the incoming waves over the complete surrounding space. This is a good reference environment for antennas and wireless terminals in multipath with fading (P.-S. Kildal and K. Rosengren, "Correlation and capacity of MIMO systems and mutual coupling, radiation efficiency and diversity gain of their antennas: Simulations and measurements in reverberation chamber", IEEE Communications Magazine, vol. 42, no. 12, pp. 102-112, December 2004). Still, the time delay spread and coherence bandwidth need to be controlled in order to resemble different environments (X. Chen, P.-S. Kildal, C. Orlenius, J. Carlsson, "Channel sounding of loaded reverberation chamber for Over-the-Air testing of wireless devices—coherence bandwidth versus average mode bandwidth and delay spread", IEEE Antennas and Wireless Propagation Letters, vol. 8, pp. 678-681, 2009). Unfortunately, such control by loading the chamber also affects the measurement uncertainty in a bad way.

The measurement uncertainty is generally described in terms of a standard deviation (STD) around the average, where the average is an estimate of the true value. Estimation of efficiency and related quantities like radiated power and receiver sensitivity is based on averaging over many samples (one for each different stirrer position). The STD is in such case inversely proportional to the square root of the number of independent samples, according to statistical theory. The number of independent samples is generally taken to be proportional to the number of excited modes in the reverberation chamber ([1] J. G. Kostas and B. Boverie, "Statistical model for a mode-stirred chamber," IEEE trans. Electromagn. Compat., vol. 33, no. 4, pp. 366-370, November 1991), but by moving the antenna around in the chamber this value can be increased to the total number of waves, that is approximately eight times the number of excited modes (K. Rosengren, P.-S. Kildal, "Study of distributions of modes and plane waves in re-verberation chamber for the characterization of antennas in a multipath environment", Microwave and Optical Technology Letters, Vol. 30, No 6, pp 386-391, September 2001). However, this is only true at low frequencies. When frequency increases the uncertainty does not improve accordingly, and is instead limited by a residual error that can be interpreted as direct coupling between the transmitting and receiving antennas or similar (P.-S. Kildal, S. Lai, and X. Chen, "Direct Coupling as a Residual Error Contribution During OTA Measurements of Wireless Devices in Reverberation Chamber", IEEE AP-S International Symposium, Charleston, Jun. 1-5, 2009).

Similar measurement chambers are also disclosed in DE 198 12 923, WO 2010/026274 and WO 2005/003795. However, the therein-disclosed solutions are all subject to similar problems in respect of measurement accuracy and the like.

Thus, despite the improvements in measurement accuracy obtained by means of the reverberation chamber in recent years, there is still a need for improvements to enhance the measurement accuracy even further.

SUMMARY OF THE INVENTION

It is therefore an object of the present invention to provide improvements in respect of measurements using the above-discussed type of measurement chamber to obtain improved measurement accuracy. In particular it is an object of the present invention to provide improvements alleviating the uncertainties of the above-mentioned measurements in the reverberation chamber, so that they can be performed faster, more accurately and with better user interface and user controllability than before. The latter is important in order to avoid mistakes and user-induced uncertainties due to such things as erroneous positioning of antennas or terminals or other objects inside the chamber.

It is therefore an object of the present invention to provide a method and an apparatus which alleviates all or at least some of the above-discussed drawbacks of the presently known systems.

This object is achieved by means of a method and an apparatus as defined in the appended claims.

As will be understood from the following description, the present invention comprises several parts which are used in the same specific context, and all being related to obtain the same purpose, viz. to obtain improved measurement accuracy. These parts can be used one by one, but preferably in combinations, and most preferably all at the same time.

The present invention may be used to communication power (TCP or simply CP). This is the total power radiated by the device under test minus the power lost in the human body. It is also useable to measure receive performance, e.g. characterized by a Bit-Error-Rate (BER) or a Frame-Error-Rate (FER). The measured sensitivity values may also be averaged over all stirrer positions, whereby the averaged results are referred to as a Total Isotropic Sensitivity (TIS), and correspond to the conductive-measured receiver sensitivity in dBm minus the total radiation efficiency of the antenna in dB.

The inventive measurement apparatus can be used for characterizing the complete performance of e.g. mobile and wireless terminals, both on transmit and receive, including transmit and receive performance of antennas, amplifiers, signal processing algorithms, and coding. This opens up a large potential for RF testing in connection with terminals for e.g. 3G and 4G (third and fourth generation of mobile communication systems). Such systems will make use of more than one antenna for both transmission and reception and will use these to adapt to the fading multipath environment, in order to improve battery life time and data rate. Such systems are known under terms as diversity antenna systems and MIMO (multiple Input Multiple Output) antenna systems. In order to develop optimum diversity and MIMO systems it is more important than ever to quantify the performance of the terminals and base station simulators in multipath environments.

According to a first aspect of the invention, there is provided an apparatus for measuring the performance of a device under test, comprising:

a chamber defining an internal cavity therein, adapted to enclose the device under test, and including walls of an inwardly reflective material, rendering the walls reflective to electromagnetic waves, thereby simulating a multi-path environment;

at least one moveable object within the cavity;

at least one chamber antenna arranged in the cavity; and a measuring instrument connected to the device under test and the chamber antenna, for measuring the transmission between them, wherein there is further provided an antenna holder comprising three surfaces of a reflective material, said surfaces extending in planes which are orthogonal in relation to each other and each surface facing away from the other surfaces, and wherein a chamber antenna is arranged on each of said at least three surfaces.

These chamber antennas correspond to the so-called wall antennas in the previous U.S. Pat. No. 7,444,264 and U.S. Pat. No. 7,286,961, and are herein referred to as chamber antennas because they are no longer required to be fixed to the walls, but rather to an antenna holder located somewhere inside the chamber away from any wall.

The term "device under test" is in the context of this application used to indicate any type of device capable of transmitting or receiving electromagnetic signals through a wireless interface. In particular, the device under test can be antennas, mobile phones and other wireless terminals.

The at least one moveable object arranged in the cavity is an object capable of obtaining a multitude of mode distributions within the cavity. Such a moveable object may also be referred to as mode stirrer or field stirrer. Such moveable objects are per se well known in the art, and are e.g. disclosed in the above-discussed U.S. Pat. No. 7,444,264 and U.S. Pat. No. 7,286,961, both said patents hereby being incorporated in their entirety by reference.

The arrangement of several chamber antennas at a location inside the chamber (and not on the walls) and in an orthogonal position in relation to each other improves the measurement accuracy. Further, by the arrangement of chamber antennas on an antenna holder comprising three surfaces of a reflective material, said surfaces extending in planes which are orthogonal in relation to each other and each surface facing away from the other surfaces, such an orthogonal relationship between the antennas is obtainable, still enabling the antennas to be arranged close together, and to be arranged at a multitude of various positions within the measurement chamber. Hereby, the position of the antennas may easily be changed for different measurement setups, and an optimal position for each measurement setup can be obtained. Further, this arrangement reduces direct coupling between the antennas, and thereby further improves the measurement accuracy.

Preferably, the three surfaces of the antenna holder are arranged adjacent each other. For example, the surface may be arranged on plates connected to each other along adjacent side edges. In particular, it is preferred that the three surfaces are arranged to coincide with three orthogonal surfaces of a hypothetical cube. Hereby, the antennas may be arranged close together, which e.g. facilitates moving and shielding of the antennas.

The three surfaces are preferably formed by plates of a reflective material, and preferably by metal.

The antenna holder may be arranged at a multitude of various positions within the measurement chamber. In one alternative embodiment, the foot of the antenna holder may be arranged on a side wall of the chamber. However, according to a presently preferred alternative, the antenna holder contains a rod on the foot, the antennas themselves thereby being separated from the walls of the chamber. The foot and the rod may be connected to or supported by, any of the side walls, roof and ceiling forming the chamber. However, preferably the foot of the rod is connected to or supported by the floor of the chamber. It is also preferred that the antenna holder is moveable within the cavity. For example, the rod may comprise a base or foot arranged to be supported by the floor, whereby the antenna holder may easily be moved around within the chamber.

The antennas may be of many different types. For example, the antennas may be of any of the types disclosed in the above-discussed U.S. Pat. No. 7,444,264 and U.S. Pat. No. 7,286,961. However, preferably the antennas form dipole-like antennas, or other small antenna types for use on ground planes.

Preferably, each of the three surfaces is directed partly upwards, towards the roof of the chamber. For example, each of the surfaces may form a 45 degree angle towards a horizontal (or vertical) plane.

In a preferred arrangement, the antenna holder is arranged at a height in the cavity such that the distance to the roof of the cavity is longer than the distance to the floor of the cavity.

The three surfaces are preferably large enough to efficiently separate the antennas from each other. At the same time, it is preferred that the surfaces are significantly smaller than the overall dimensions of the cavity within the chamber. To this end, the three surfaces each preferably has a maximum extension which is less than ½, and more preferably less than ⅓, and most preferably less than ¼, of the narrowest distance between any two opposing walls in the cavity. It is also preferred that the three surfaces each has a maximum extension which is less than the largest wavelength (lowest frequency) for testing, and preferably less than ¾ of said wavelength, and preferably about ½ of said wavelength.

Preferably, the chamber antenna(s) is/are placed at a distance from the side walls, floor and roof of the chamber. Preferably this distance exceeds ½ wavelength from each wall, floor and roof of the chamber, of the frequency used for testing.

According to another aspect of the invention there is provided an apparatus for measuring the performance of a device under test, comprising:

a chamber defining an internal cavity therein, adapted to enclose the device under test, and including walls of an inwardly reflective material, rendering the walls reflective to electromagnetic waves, thereby simulating a multi-path environment;

at least one moveable object within the cavity;

at least one chamber antenna arranged in the cavity;

a measuring instrument connected to the device under test and the chamber antenna, for measuring the transmission between them; and a shield arranged between the device under test and the chamber antenna(s), such that a line of sight between the device under test and the chamber antenna(s) is obscured by the shield, wherein the shield has a width extension between two opposing side walls of the chamber in the range of 30-70%, and preferably 40-60%, of the distance between said opposing side walls, and a height extension between a roof and a floor of the chamber in the range 30-70%, and preferably 40-60%, of the distance between said floor and roof.

By means of such a shield, the direct coupling between the chamber antenna(s) and the device under test is strongly reduced, and at the same time, the shield does only insignificantly reduce the multimode distribution within the chamber. Hereby, the measurement accuracy is improved.

The use of shield to avoid so-called line of sight between a device under test and a chamber antenna has previously been proposed in the above-discussed DE 198 12 923 and WO 2005/003795. However, both of these previously proposed solutions are inefficient, and lead to inaccuracy in the measurements. In DE 198 12 923 a very large shield is proposed, which will greatly affect the mode distribution within the chamber, whereas WO 2005/003795 propose a field stirrer to shield the line of sight. However, in this case, the shield is relatively small, and only leads to minor improvements in respect of reducing direct coupling between the chamber antenna and the device under test.

However, the present inventors have realized that by the provision of a shield which has a width extension between two opposing side walls of the chamber in the range 30-70%, and preferably 40-60%, of the distance between said opposing side walls, and a height extension between a roof and a floor of the chamber in the range 30-70%, and preferably 40-60%, of the distance between said floor and roof, a very efficient shielding effect can be obtained. The direct coupling between the chamber antenna(s) and the device under test is strongly reduced, and at the same time, the shield does only insignificantly reduce the number of excited modes within the chamber and thereby the number of independent samples. Hereby, the measurement accuracy is improved.

It has also been found that the width and height extensions of the shield preferably are larger than the wavelength used for testing, and preferably larger than two wavelengths.

Still further, the shield preferably has a non-linear extension in the width direction, and preferably a curved or angled extension, whereby the shield partly surrounds the chamber antenna(s). Hereby, an even better shielding effect is obtained, and still with very limited influence on the number of excited modes within the chamber and thereby the number of independent samples.

The shield is preferably arranged at a distance from the chamber antenna(s), said distance corresponding to at least ½ wavelength used for testing.

In a particularly preferred embodiment, the shield of the above-discussed type is used in combination with the antenna holder as discussed above in relation to the first aspect of the invention. Thus, it is preferred that there is further provided an antenna holder comprising three surfaces of a reflective material, said surfaces extending in planes which are orthogonal in relation to each other and each surface facing away from the other surfaces, and wherein a chamber antenna is arranged on each of said at least three surfaces. Further, the antenna holder is preferably arranged on a rod, the antennas thereby being separated from each of the walls of the chamber.

The antenna holder and/or the shield may be moveable within the cavity. Hereby, the antenna holder and/or the shield may be moved between measurement setups, in order to optimize for various measurement types and conditions. Still further, the antenna holder and/or shield may, for some embodiments, also be moveable during measurements.

The chamber antenna(s) is preferably placed at a distance exceeding ½ wavelength of the radiation used for testing from each wall, floor and roof of the chamber.

According to still another aspect of the invention, there is provided an apparatus for measuring the performance of a device under test, comprising:

a chamber defining an internal cavity therein, adapted to enclose the device under test, and including walls of an inwardly reflective material, rendering the walls reflective to electromagnetic waves, thereby simulating a multi-path environment;

at least one moveable object within the cavity;

at least one chamber antenna arranged in the cavity;

a measuring instrument connected to the device under test and the chamber antenna, for measuring the transmission between them; and a video camera inside the cavity, said video camera being able to forward video information from the interior of the chamber to the exterior of the chamber during testing.

It has previously been known to arrange a window in measurement chambers of this type, as is disclosed e.g. in the above-discussed U.S. Pat. No. 7,444,264 and U.S. Pat. No. 7,286,961. However, the usefulness of such windows are of limited practical importance, since it only allows for a limited part of the chamber to be watched. Further, it is difficult to use such visual observations to analyze measurement data and the like. Still further, it is often difficult to obtain an adequate electromagnetic shielding of the chamber when such windows are used, and consequently electromagnetic waves in the near-by environment may negatively affect the measurement. Electromagnetic shielding in the order of 100 dB may be needed when measuring receiver sensitivity and throughput in order to avoid measurement errors due to interference from wireless stations and instruments outside the chamber.

By means of the present invention there is provided a video camera arranged inside the cavity, which makes it possible to monitor the measuring set-up during measurement, in order e.g. to be able to detect errors occurring in respect of moving objects within the chamber. For example, it is hereby possible to monitor the movement of the moving objects, used to obtain a multitude of mode-distributions within the chamber, and/or the movement of a moveable holder, such as a turntable, on which the device under test may be placed.

The video information may be correlated to the measuring data, and hereby the measurement data may be analyzed also in relation to the movements occurring in the chamber, which provides a deeper understanding of the measurement data. For example, this may be used to provide information about the progress and convergence of the estimates, to ensure no user mistakes.

The video information is preferably recorded or stored in a memory, which enables to monitor the video information not only in real-time, but also subsequently, when analyzing the measurement data. This also enables the video data to be forwarded, preferably together with the measurement data, to a remote location. The information may be forwarded through a network or indirectly by storing the information on a data carrier, such as a memory stick, a CD or a DVD. Hereby, the measurements may be monitored and supervised by persons at other locations than where the measurement chamber is located. Further, this enables for example a manufacturer of the equipment to identify errors and/or erroneous handling of the chamber, etc.

Preferably, the apparatus further comprises a display arranged outside the cavity, said display being able to reproduce the video information received from the video camera. For example, the display may be mounted on an external wall of the chamber. The display is further preferably adapted to show measurement data received from the measuring instrument in correlation to the video information.

In the measurement chamber in which the video camera is used, at least one, and preferably both, of the device under test and the at least one moving object is/are arranged to be moved within the cavity during testing.

According to still another aspect of the invention, there is provided an apparatus for measuring the performance of a device under test, comprising:

a chamber defining an internal cavity therein, adapted to enclose the device under test, and including walls of an inwardly reflective material, rendering the walls reflective to electromagnetic waves, thereby simulating a multi-path environment;

at least one moveable object within the cavity;

at least one chamber antenna arranged in the cavity;

a measuring instrument connected to the device under test and the chamber antenna, for measuring the transmission between them;

wherein the device under test is used as a receiving device, and wherein the chamber antenna(s) are used as transmitters, and are connected to a signal providing instrument, also called digital communication test instrument, and wherein the apparatus further comprises a wireless channel emulator arranged between the signal providing instrument and the chamber antenna(s), the emulator being arranged to process the signals to be transmitted to emulate a real-life wireless channel with certain time-delay spread, coherence bandwidth and fading.

By using such an emulator, it is possible to emulate specific conditions, such as being within a car, being in an area with low radio coverage, etc. This is particularly useful for measurements of throughput, AFS (Average Fading Sensitivity) and TIS (Total Isotropic Sensitivity). The emulator may be used to change the time delay spread and coherence bandwidth of the multipath channel to the device under test in order to resemble real-life environments. Thereby, it is avoided to load the chamber with absorbing objects, which is undesirable because this make the uncertainty worse (in addition to reducing time delay spread).

Thus, preferably, emulator is arranged to change the at least one of the time delay spread and coherence bandwidth of the signals received from the signal providing instrument.

The signal providing instrument may comprise a base station simulator. It is further possible to arrange the base station simulator in a second chamber defining an internal cavity therein, and including walls of an inwardly reflective material, rendering the walls reflective to electromagnetic waves, thereby simulating a multi-path environment, and further comprising at least one receiving antenna for output of the signals, and to use this arrangement as the signal providing instrument.

According to still another aspect of the invention, there is provided a method for measuring the performance of a device under test, comprising:

arranging a device under test within a chamber defining an internal cavity therein, and including walls of an inwardly reflective material, rendering the walls reflective to electromagnetic waves, thereby simulating a multi-path environment;

providing at least one moveable object within the cavity, said object being moveable during testing;

measuring the transmission between the device under test and at least one chamber antenna; and supervising the inside of the cavity by means of a video camera arranged within the cavity during testing, whereby video information from the interior of the chamber is forwarded to the exterior of the chamber.

Hereby, similar embodiments and advantages as discussed above are feasible. The method further preferably comprises the step of moving the device under test within the cavity during testing.

According to still another aspect of the invention, there is provided a method for measuring the performance of a device under test, comprising:

arranging a device under test within a chamber defining an internal cavity therein, and including walls of an inwardly reflective material, rendering the walls reflective to electromagnetic waves, thereby simulating a multi-path environment;

providing at least one moveable object within the cavity, said object being moveable during testing;

measuring the transmission between the device under test and at least one chamber antenna; and wherein the device under test is used as a receiving device, and wherein the chamber antenna(s) are used as transmitters, and are connected to a signal providing instrument, and wherein the method further comprises processing of the signal from the signal providing instrument with a signal emulator arranged between the signal providing instrument and the chamber antenna(s), the emulator processing the signals to be transmitted to emulate at least one real-life condition.

Hereby, similar embodiments and advantages as discussed above are feasible.

The step of processing the signal from the signal providing instrument may comprise the steps of adding signals obtained from measurements measured at the real-life conditions to be emulated, and to reduce from the signal the signals obtained in the chamber when the signals from the signal providing instrument are used in an unprocessed condition. Hereby, the processing in software of the signals received by the signal providing instrument enables the signals provided to the chamber to resemble the real-life situation, without the influence of the specific conditions related to the measurement chamber.

These and other features and advantages of the present invention will in the following be further clarified with reference to the embodiments described hereinafter.

BRIEF DESCRIPTION OF THE DRAWINGS

For exemplifying purposes, the invention will be described in closer detail in the following with reference to embodiments thereof illustrated in the attached drawings, wherein.

DETAILED DESCRIPTION OF PREFERRED EMBODIMENTS

In the following detailed description, preferred embodiments of the present invention will be described. However, it is to be understood that features of the different embodiments are exchangeable between the embodiments and may be combined in different ways, unless anything else is specifically indicated. Even though in the following description, numerous specific details are set forth to provide a more thorough understanding of e present invention, it will be apparent to one skilled in the art that the present invention may be practiced without these specific details. In other instances, well-known constructions or functions are not described in detail, so as not to obscure the present invention.

Figure 1:
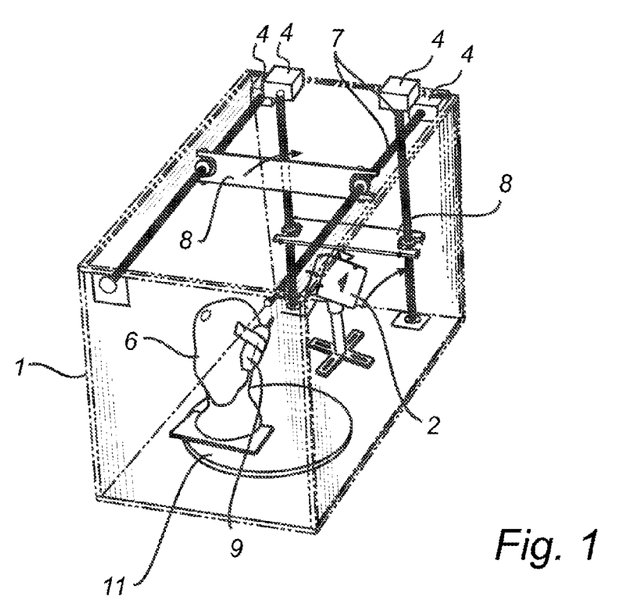
FIG. 1 is a perspective view showing a schematic illustration of a measurement apparatus according to an embodiment of the present invention.
Figure 2:
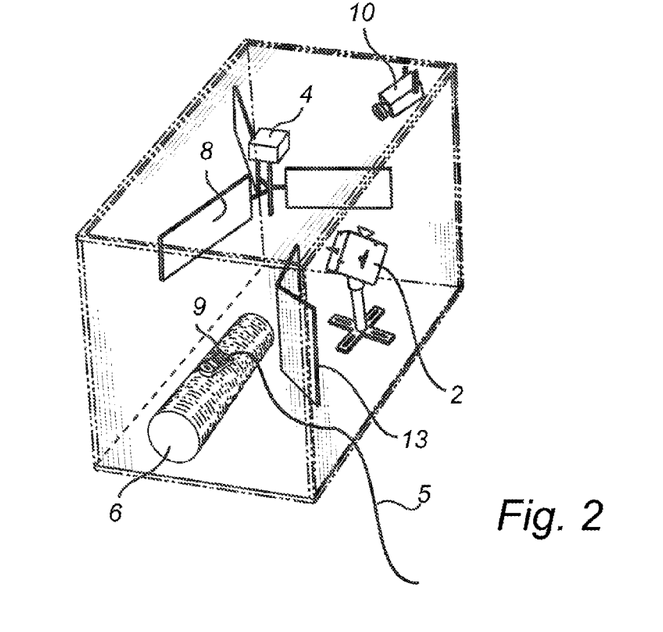
FIG. 2 is a perspective view showing a schematic illustration of a measurement apparatus according to another embodiment of the present invention.

FIGS. 1 and 2 show two embodiments of an apparatus for measuring the performance of a device under test, such as antennas and mobile or wireless terminals, and specifically for antennas and terminals intended to be used in a multipath environment, according to a first embodiment of the invention. The apparatus comprises a rectangular chamber 1 with width W, length L and height H, and with a door (not shown). The chamber is provided with reflecting walls. We use here the word wall to describe sidewalls, ceiling and floor. The reflecting walls are most easily provided with metal foil or plates.

The chamber can have any size and shape. However, preferably, the chamber is dimensioned to be portable. Preferably, the measurement chamber provides a cavity with a space in the range 0.5-20 m$^3$. The chamber will normally of practical reasons be rectangular. Other shapes, which are easy to realize, are vertical walls with flat floor and ceiling and with a horizontal cross-section that forms a circle, ellipse or polygon.

In the cavity formed by the measurement chamber, at least one moveable object is provided. Such moveable objects to obtain a mode distribution in the chamber are per se well known in the art, and may take various forms. For example, the moveable object may comprise an object 8 which is rotatable around an axis of rotation, as illustrated in FIG. 2. Another possibility is to use elongated objects 8, such as plates, being displaceable by means of e.g. screws 7 which is rotated around by a driving means, such as a servo motor or a step motor 4, and a nut on this screw to which the elongate narrow object 8 is fastened. It is however possible to use other means for displacing the elongate object. The long narrow object has the form of a metal sheet, but it can also have many other forms, e.g. it is advantageous to give it an irregular form. The movement of the elongate object could be made intermittently between measurements or during a measurement, or even be performed continuously during a measurement. The moveable object may additionally or alternatively comprise a rotatable platform 11, such as a turntable. When using at least two moving objects 8, they could be moved simultaneously or sequentially.

The moveable object(s) may functionally be referred to as field stirrer(s) or mode stirrer(s), and are preferably operable to scan continuously across the length and/or width of the chamber. In this manner, continuous variation in the internal structure of the chamber is provided. The variation causes multiple changing reflections of electromagnetic waves within the chamber as the field stirrer scans. These changing reflected waves interfere with one another differently and form modes with varying excitations. Thereby, the number of independent samples increases, which is desirable for testing purposes as it mimics the multipath of the real environment in which such a device is to be used. Field stirring in this manner can produce the effect of a large number of excited modes and thus simulate a rich multipath environment.

The cavity may also include a near-in-structure 6 in the form of e.g. a head phantom, as illustrated in FIG. 1, a dielectric cylinder, as illustrated in FIG. 2, e.g. filled with lossy material with similar dielectric properties as human tissue, a wooden box, e.g. simulating a table surface, and the like.

More general details and examples in relation to the measurement chamber and how it may be operated are available from U.S. Pat. No. 7,444,264 and U.S. Pat. No. 7,286,961, both said patents hereby being incorporated in their entirety by reference.

The device under test 9 may comprise a transmitting and/or receiving antenna, and is preferably arranged in close relation to the near-in environment. For measurements, the device under test may be placed in the chamber according to the chosen talk position. For free space measurements, the head phantom may be located in the chamber in order to keep the same average transmission level and same delay spread and coherence bandwidth, but the phone is preferably placed at a distance of 0.7 wavelengths, or more, away from the head phantom. Thereby the antenna efficiency will not be affected by the head phantom, thus corresponding to free space measurements.

Figure 3:
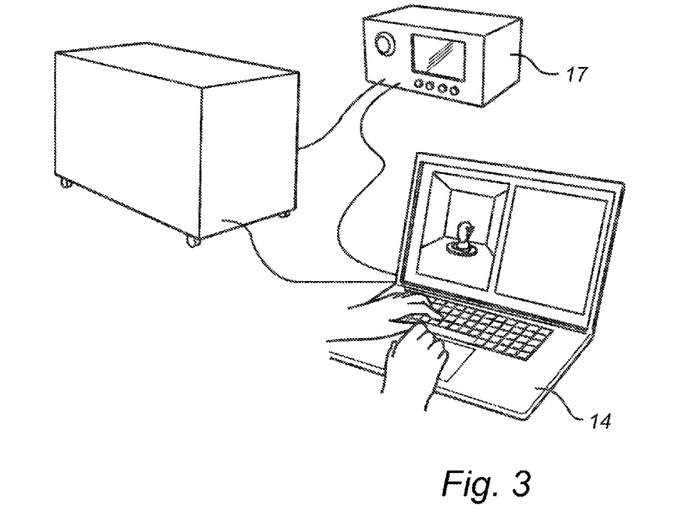
FIG. 3 is a perspective view showing a schematic illustration of a measurement apparatus according to still another embodiment of the present invention.

Further, there is provided as least one chamber antenna in the chamber. The chamber antenna 21 could comprise an electric monopole, a helical antenna, a microstrip antenna or similar small antennas. However, preferably, the chamber antenna comprises a dipole-like antenna. Further, the chamber antenna is preferably connected to an exterior measurement instrument 14 through a cable located inside the rod 23 and going through the wall of the chamber. The measuring instrument is used for measuring the transmission between the chamber antenna and the device under test, The measurement instrument comprises analyzing means, illustrated by the PC 14 in FIG. 3, and can e.g. comprise a commercially available measuring instrument 17, such as a network analyzer or spectrum analyzer or similar, for determining the transmitted power between the antennas.

Figure 4:
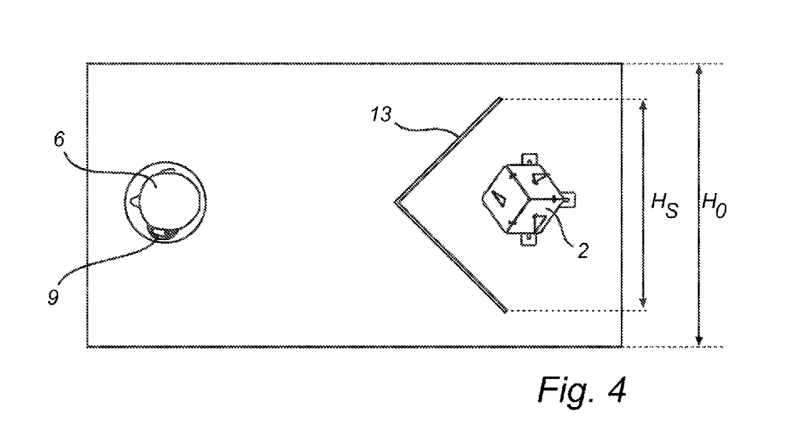
FIG. 4 is a top view showing a schematic illustration of a measurement apparatus according to still another embodiment of the present invention.
Figure 5:
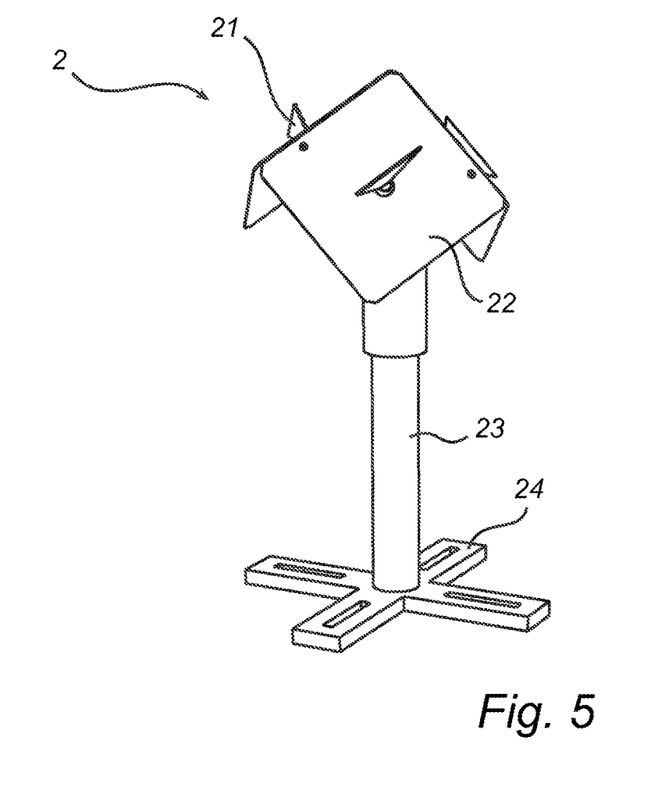
FIG. 5 is a perspective view showing the chamber antenna holder of the embodiments illustrated in FIGS. 1 and 4.

Preferably the chamber antennas 21 are provided on an antenna holder 2 comprising three surfaces 22 of a reflective material, as shown in FIG. 5. These surfaces extend in planes which are orthogonal in relation to each other and each surface faces away from the other surfaces, and one chamber antenna is arranged on each of these surfaces. Such an arrangement is illustrated in FIGS. 1 and 4, and in more detail in FIG. 5.

Preferably, the three surfaces of the antenna holder are arranged adjacent each other. In the illustrated example, the surfaces are arranged on plates connected to each other along adjacent side edges, whereby the three surfaces coincide with three orthogonal surfaces of a hypothetical cube. The three surfaces 22 are preferably formed by plates of a reflective material, and preferably by metal.

These surfaces may be arranged at a multitude of various positions within the measurement chamber. In one alternative embodiment, the antenna holder may be arranged on a side wall of the chamber. However, according to a preferred alternative, the antenna holder is arranged on a rod 23, the antennas themselves thereby being separated from each of the walls of the chamber. The rod may be connected to or supported by, any of the side walls, roof and ceiling forming the chamber. However, preferably the rod is supported by the floor of the chamber, e.g. by a foot 24. Hereby, the antenna holder also becomes moveable within the cavity.

Each of the three surfaces 21 is preferably directed partly upwards, towards the roof of the chamber. In the illustrated example, each of the surfaces forms a 45 degree angle towards a horizontal (and vertical) plane.

Further, the antenna holder is here arranged at a height in the cavity such that the distance to the roof of the cavity is longer than the distance to the floor of the cavity. Further, the chamber antenna(s) is/are here placed at a distance from the side walls, floor and roof of the chamber, and preferably this distance exceeds ½ wavelength used for testing from each wall, floor and roof of the chamber.

The measuring apparatus further preferably comprises a shield 13 arranged between the device under test and the chamber antenna(s), such that a line of sight between the device under test and the chamber antenna(s) is obscured by the shield. This is illustrated in FIGS. 2 and 4. The shield has a width extension Hs between two opposing side walls of the chamber in the range 30-70%, and preferably 40-60%, of the distance Ho between said opposing side walls, and a height extension between a roof and a floor of the chamber in the range 30-70%, and preferably 40-60%, of the distance between the floor and the roof.

The shield preferably has a non-linear extension in the width direction, and preferably a curved or angled extension, whereby the shield partly surrounds the chamber antenna(s). In the embodiment illustrated in FIG. 4, the shield has an angled extension.

The shield is preferably moveable within the cavity. Hereby the shield may be freely standing on the floor. However, alternatively, locking means or the like may be provided to fix the shield in a desired position.

Further, a video camera 10 is preferably arranged inside the cavity, as illustrated in FIG. 2. The video camera is able to forward video information from the interior of the chamber to the exterior of the chamber during testing. The video information is preferably forwarded to the measurement instrument 14, and the video information may be correlated to the measuring data The video information is preferably recorded or stored in a memory, which enables to monitor the video information not only in real-time, but also subsequently, when analyzing the measurement data.

Further there is preferably provided a display arranged outside the cavity able to reproduce the video information received from the video camera. For example, the display may be mounted on an external wall of the chamber, and/or on a stand-alone measurement instrument or PC 14.

Figure 6:
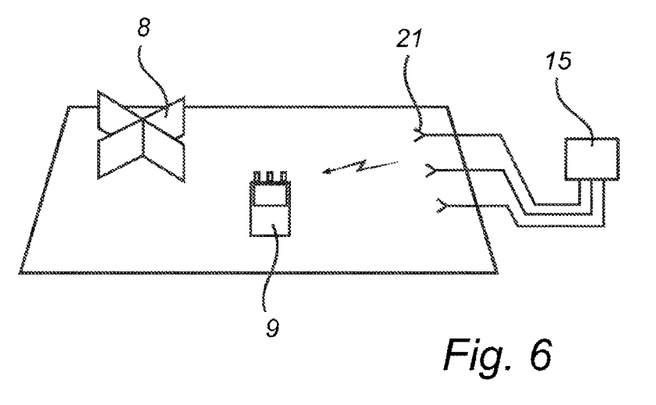
FIGS. 6-8 are schematic views illustrating measurement apparatuses according to embodiments of the present invention.

For measurements where the device under test is used as a receiving device, and the chamber antenna(s) are used as transmitters, the chamber antenna(s) are preferably connected to a signal providing instrument 15, as schematically illustrated in FIG. 6. The signal providing instrument may e.g. be a base station simulator.

Figure 7:
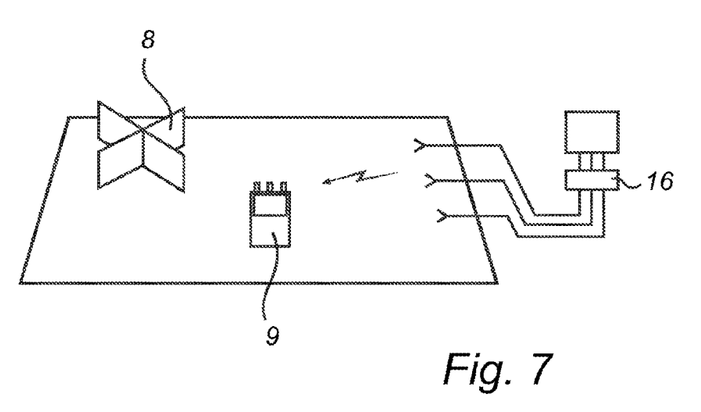

In addition, a signal emulator 16 may be arranged between the signal providing instrument 15 and the chamber antenna(s) 21, as is schematically illustrated in FIG. 7. The emulator is arranged to process the signals to be transmitted to emulate at least one real-life condition. By using such an emulator, it is possible to emulate specific conditions, such as being within a car, being in an area with low radio coverage, etc. The emulator may be used to change the time delay spread and coherence bandwidth of the multipath channel to the device under test in order to resemble real-life environments. The emulator is preferably at least one of a fading emulator and a channel emulator.

Figure 8:
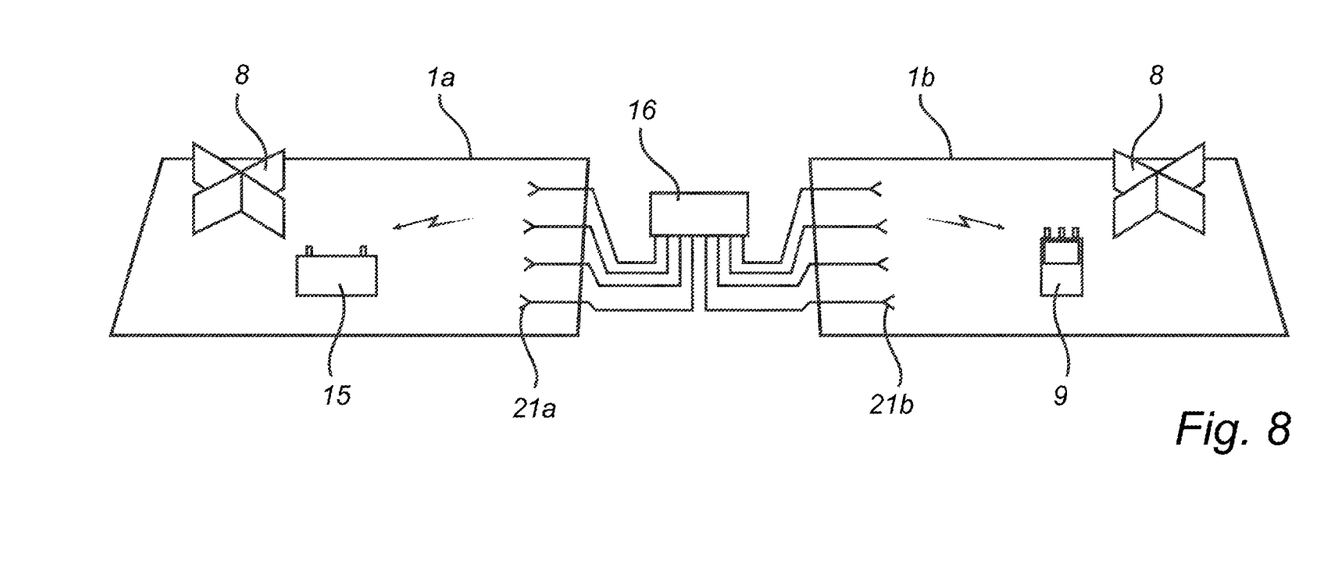

In a further embodiment, as illustrated in FIG. 8, two measurement chambers 1A and 1B are used. The base station simulator 15 is arranged in a first chamber 1A, and the chamber comprises receiving chamber antennas 21A to receive the signals from the chamber. The signals are forwarded to an emulator 16, such as a fading emulator, and further forwarded to transmitting chamber antennas 21B arranged in the second chamber 1B, in which the device under test 9 is arranged. Hereby, the first chamber forms the signal providing instrument.

The step of processing the signal from the signal providing instrument may comprise the steps of adding signals obtained from measurements measured at the real-life conditions to be emulated, and to reduce from the signal the signals obtained in the chamber when the signals from the signal providing instrument are used in an unprocessed condition. Hereby, the processing in software of the signals received by the signal providing instrument enables the signals provided to the chamber to resemble the real-life situation, without the influence of the specific conditions related to the measurement chamber.

The invention has now been described with reference to specific embodiments. However, several variations of the communication system are feasible. For example, the various features discussed in the foregoing may be combined in various ways. Such and other obvious modifications must be considered to be within the scope of the present invention, as it is defined by the appended claims. It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting to the claim. The word "comprising" does not exclude the presence of other elements or steps than those listed in the claim. The word "a" or "an" preceding an element does not exclude the presence of a plurality of such elements. Further, a single unit may perform the functions of several means recited in the claims.

The invention claimed is:

1. An apparatus for measuring the performance of a device under test, comprising:
    a chamber defining an internal cavity therein, adapted to enclose the device under test, and including walls of an inwardly reflective material, rendering the walls reflective to electromagnetic waves, thereby simulating a multi-path environment;
    at least one moveable object within the cavity;
    at least one chamber antenna arranged in the cavity;
    a measuring instrument connected to the device under test and the chamber antenna, for measuring the transmission between them; and
    a shield arranged between the device under test and the chamber antenna(s), such that a line of sight between the device under test and the chamber antenna(s) is obscured by the shield,
    wherein the shield has a width extension between two opposing side walls of the chamber in the range 30-70% of the distance between said opposing side walls, and a height extension between a roof and a floor of the chamber in the range 30-70% of the distance between said floor and roof.

2. The apparatus of claim 1, wherein the width and height extensions of the shield are larger than the wavelength of the radiation used for testing, and preferably larger than two wavelengths.

3. The apparatus of claim 1, wherein the shield has a non-linear extension in the width direction, and preferably a curved or angled extension, whereby the shield partly surrounds the chamber antenna(s).

4. The apparatus of claim 1, wherein the shield is arranged at a distance from the chamber antenna(s), said distance corresponding to at least ½ a wavelength of the radiation used for testing.

5. The apparatus of claim 1, wherein there is further provided an antenna holder comprising three surfaces of a reflective material, said surfaces extending in planes which are orthogonal in relation to each other and each surface facing away from the other surfaces, and wherein a chamber antenna is arranged on each of said at least three surfaces.

6. The apparatus of claim 5, wherein the three surfaces are arranged adjacent each other.

7. The apparatus of claim 5, wherein the three surfaces are arranged to coincide with three orthogonal surfaces of a hypothetical cube.

8. The apparatus of claim 5, wherein the three surfaces are formed by plates of a reflective material, and preferably by metal.

9. The apparatus of claim 5, wherein the antenna holder is arranged on a side wall of the chamber.

10. The apparatus of claim 5, wherein the antenna holder is arranged on rod, the antenna holder thereby being separated from each of the walls of the chamber.

11. The apparatus of claim 5, wherein the antenna holder is moveable within the cavity.

12. The apparatus of claim 5, wherein the chamber antennas form dipoles.

13. The apparatus of claim 5, wherein each of the three surfaces are directed partly upwards, towards the roof of the chamber.

14. The apparatus of claim 13, wherein the antenna holder is arranged at a height in the cavity such that the distance to the roof of the cavity is longer than the distance to the floor of the cavity.

15. The apparatus of claim 5, wherein the three surfaces each has a maximum extension which is less than ½, and preferably less than ⅓, and most preferably less than ¼, of the narrowest distance between any two opposing walls in the cavity.

16. The apparatus of claim 5, wherein the three surfaces each has a maximum extension which is less than the wavelength of the radiation used for testing, and preferably less than ¾ of said wavelength, and preferably about ½ of said wavelength.

17. The apparatus of claim 5, wherein the chamber antenna(s) is placed at a distance exceeding ½ wavelength of the radiation used for testing from each wall, floor and roof of the chamber.

18. The apparatus of claim 17, wherein the chamber antenna(s) is placed at a distance exceeding ½ wavelength of the radiation used for testing from each wall, floor and roof of the chamber.

19. The apparatus of claim 5, wherein the antenna holder is arranged on a rod, the antenna holder thereby being separated from each of the walls of the chamber.

20. The apparatus of claim 5, wherein both the antenna holder and the shield are moveable within the cavity.

21. The apparatus of claim 1, further comprising:
a video camera inside the cavity, said video camera being able to forward video information from the interior of the chamber to the exterior of the chamber during testing.

22. The apparatus of claim 21, further comprising a display arranged outside the cavity, said display being able to reproduce the video information received from the video camera.

23. The apparatus of claim 22, wherein the display is further adapted to show measurement data received from the measuring instrument in correlation to the video information.

24. The apparatus of claim 21, wherein at least one, and preferably both, of the device under test and the at least one moving object is arranged to be moved within the cavity during testing.

25. The apparatus of claim 1,
wherein the device under test is used as a receiving device, and wherein the chamber antenna(s) are used as transmitters, and are connected to a signal providing instrument, and wherein the apparatus further comprises a signal emulator arranged between the signal providing instrument and the chamber antenna(s), the emulator being arranged to process the signals to be transmitted to emulate at least one real-life condition.

26. The apparatus of claim 25, wherein the emulator is arranged to change at least one of the time delay spread, coherence bandwidth and fading of the signals received from the signal providing instrument.

27. The apparatus of claim 25, wherein the emulator is at least one of a fading emulator and a wireless channel emulator.

28. The apparatus of claim 25, wherein the signal providing instrument is a base station simulator.

29. The apparatus of claim 28, wherein the signal providing instrument is a base station simulator arranged in a second chamber defining an internal cavity therein, and including walls of an inwardly reflective material, rendering the walls reflective to electromagnetic waves, thereby simulating a multi-path environment, and further comprising at least one receiving antenna for output of the signals.

30. The apparatus of claim 25, wherein the measuring instrument is arranged to measure at least one of: throughput, AFS (Average Fading Sensitivity), TIS (Total Isotropic Sensitivity) and TRP (Total Radiated Power).

31. The apparatus of claim 1, wherein the shield has a width extension between two opposing side walls of the chamber in the range 40-60% of the distance between said opposing side walls.

32. The apparatus of claim 1, wherein the shield has a height extension between a roof and a floor of the chamber in the range 40-60% of the distance between said floor and roof.

* * * * *